United States Patent [19]

Shimomura et al.

[11] Patent Number: 5,572,549

[45] Date of Patent: Nov. 5, 1996

[54] NOISE CANCEL CIRCUIT CAPABLE OF CANCELLING NOISE FROM A PULSE SIGNAL

[75] Inventors: Yuka Shimomura; Yasushi Aoki, both of Tokyo, Japan

[73] Assignee: NEC Corporation, Tokyo, Japan

[21] Appl. No.: 429,686

[22] Filed: Apr. 27, 1995

[30] Foreign Application Priority Data

Apr. 27, 1994 [JP] Japan .................................. 6-90094

[51] Int. Cl.⁶ .................................................. H04B 15/00
[52] U.S. Cl. .......................... 375/285; 375/346; 327/165; 327/170
[58] Field of Search .................................... 375/346, 285; 348/607; 327/133, 134, 165, 170, 172, 175, 262, 384, 385, 551; 455/296

[56] References Cited

U.S. PATENT DOCUMENTS

| 3,626,303 | 12/1971 | Wilcox | 325/474 |
| 3,947,848 | 3/1976 | Carnahan et al. | 343/18 |
| 3,979,683 | 9/1976 | Ikeda | 328/165 |
| 4,885,639 | 12/1989 | Nakata et al. | 358/167 |
| 5,448,309 | 9/1995 | Won | 348/607 |

FOREIGN PATENT DOCUMENTS 61-98014  5/1986  Japan .

*Primary Examiner*—Stephen Chin
*Assistant Examiner*—Don Vo
*Attorney, Agent, or Firm*—Sughrue, Mion, Zinn, Macpeak & Seas

[57] ABSTRACT

In a noise cancel circuit for cancelling leading and travelling noises from an input pulse signal comprising a sequence of input pulses each of which is defined by a predetermined input pulse period and a predetermined input pulse width, a leading noise cancel circuit cancels the leading noise from the input pulse signal and produces a leading noise cancelled signal. A trailing noise cancel circuit cancels the trailing noise from the leading noise cancelled signal and produces a trailing noise cancelled signal. Thus, the noise cancel circuit produces an output pulse signal comprising a sequence of output pulses each of which is defined by an output pulse period equal to the predetermined input pulse period and an output pulse width equal to the predetermined input pulse width.

7 Claims, 3 Drawing Sheets

NOISE CANCEL CIRCUIT CAPABLE OF CANCELLING NOISE FROM A PULSE SIGNAL

BACKGROUND OF THE INVENTION

This invention relates to a noise cancel circuit capable of cancelling noise components from a pulse signal without a change of a duty ratio. Such a noise cancel circuit is particularly useful in an electronic device such as a television receiver, a telephone set, and so on.

A pulse signal is used in an electronic device such as a television receiver and a telephone set. In such an electronic device, the pulse signal generally comprises a sequence of pulses each of which has leading and trailing edges. Each of the pulses is defined by a predetermined pulse period, a predetermined pulse width, and a predetermined duty ratio defined by the predetermined pulse period and the predetermined pulse width. There is a case that the pulse signal has noise components while the pulse signal passes through a variety of circuit elements in the electronic device. As an example of the noise components, leading and trailing noises are well known. The leading and the trailing noises originate from the leading and the trailing edges, respectively, of the pulses and have a noise width. In other words, the leading and the trailing noises occur at the leading and the trailing edges. At any rate, such the leading and the trailing noises must be cancelled from the pulse signal.

For this purpose, a noise cancel circuit is used in the electronic device. In this case, the pulse signal is supplied to the noise cancel circuit as an input pulse signal. The noise cancel circuit comprises a delay circuit and a D-type flip-flop circuit. The delay circuit is for giving a delay time duration to the input pulse signal and produces a delayed input pulse signal having the delay time duration. The delay time duration is longer than the noise width and is shorter than the predetermined pulse width. The D-type flip-flop circuit has a D-input terminal and a clock terminal. The D-input terminal is directly supplied with the input pulse signal while the clock terminal is supplied with the delayed input pulse signal. As a result, the D-type flip-flop circuit produces an output pulse signal in which the leading noise is cancelled. Such a noise cancel circuit is disclosed in Japanese Unexamined Patent Publication No. 98014/1986 (Tokkai Sho 61-98014).

In this case, the output pulse signal comprises a sequence of output pulses each of which has an output pulse width. The output pulse width is equal to a difference between the predetermined pulse width and the delay time duration. This means that the duty ratio of the output pulse signal is different from that of the input pulse signal. Furthermore, the noise cancel circuit mentioned above can not cancel the trailing noise.

SUMMARY OF THE INVENTION

It is therefore an object of this invention to provide a noise cancel circuit which is capable of cancelling at trailing noise in addition to a leading noise.

It is another object of this invention to provide the noise cancel circuit which is capable of preventing the change of a duty ratio.

Other objects of this invention will become clear as the description proceeds.

On describing the gist of this invention, it is possible to understand that a noise cancel circuit is for cancelling leading and trailing noise components from an input pulse signal comprising a sequence of input pulses each of which has a leading edge and a trailing edge and which is defined by a predetermined input pulse period and a predetermined input pulse width. The leading and the trailing noise components originate from the leading and the trailing edges, respectively.

According to this invention, the noise cancel circuit produces an output pulse signal comprising a sequence of output pulses each of which is defined by an output pulse period equal to the predetermined input pulse period and an output pulse width equal to the predetermined input pulse width. The noise cancel circuit comprises a leading noise cancel circuit supplied with the input pulse signal for cancelling the leading noise component from the input pulse signal to produce a leading noise cancelled signal. The noise cancel circuit further comprises a trailing noise cancel circuit connected to the leading noise cancel circuit for cancelling the trailing noise component from the leading noise cancelled signal to produce a trailing noise cancelled signal as the output pulse signal.

DESCRIPTION OF THE PREFERRED EMBODIMENT

Figure 1:
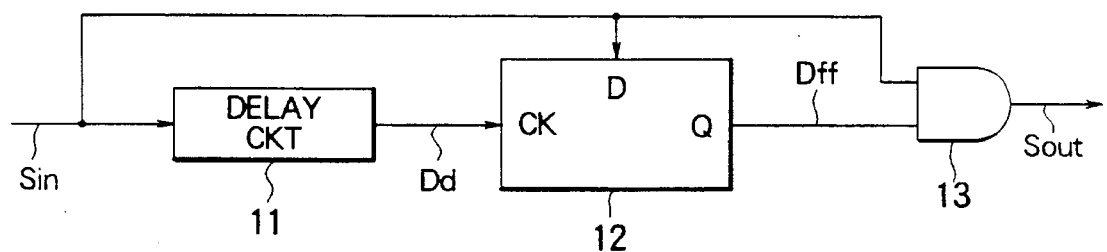
FIG. 1 shows a circuit diagram of a conventional noise cancel circuit.
Figure 2:
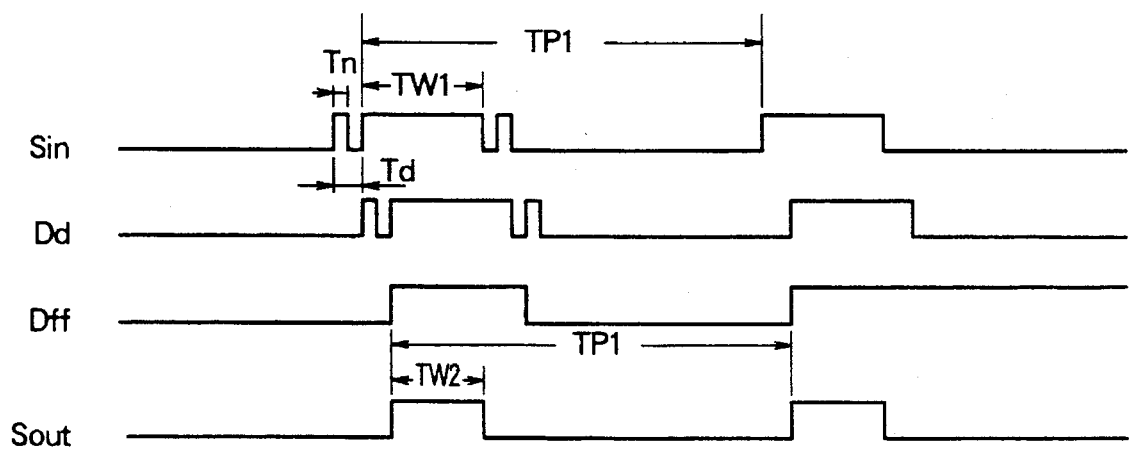
FIG. 2 shows waveforms for use in describing operation of the noise cancel circuit illustrated in FIG. 1.

Referring to FIGS. 1 and 2, description will be made at first as regards a conventional noise cancel circuit in order to facilitate an understanding of this invention. The noise cancel circuit comprises a delay circuit 11, a D-type flip-flop circuit 12, and an AND gate circuit 13. The noise cancel circuit is supplied with an input pulse signal Sin and produces an output pulse signal Sout. The input pulse signal Sin comprises a sequence of pulses each of which has leading and trailing edges. Each of the pulses is defined by a pulse period TP1 and a pulse width TW1. The input pulse signal Sin has a first duty ratio given by TW1/TP1.

As shown in a top line of FIG. 2, there is a case that the input pulse signal Sin has heading and trailing noises which occur at the leading and the trailing edges. Each of the leading and the trailing noises has a noise width Tn.

As shown in a second line of FIG. 2, the delay circuit 11 is for giving a delay time duration Td to the input pulse signal Sin and produces a delayed input pulse signal Dd having the delay time duration Td. The delay time duration Td is a little longer than the noise width Tn and is shorter than the pulse width TW1. The D-type flip-flop circuit 12 has a D-input terminal D and a clock terminal CK. The D-input terminal D is directly supplied with the input pulse signal Sin while the clock terminal CK is supplied with the delayed input pulse signal Dd. The D-type flip-flop circuit 12 produces a circuit output signal Dff illustrated in a third line of FIG. 2. The input pulse signal Sin and the circuit output signal Dff are supplied to the AND gate circuit 13. As a result, the AND gate circuit 13 delivers the output pulse signal Sout in which the leading and the trailing noises are cancelled as shown in a fourth line of FIG. 2. The output pulse signal Sout has an output pulse width TW2 and the pulse period TP1.

As obvious from the fourth line of FIG. 2, the output pulse width TW2 is equal to a difference between the pulse width TW1 and the delay time duration Td. As a result, the output pulse signal Sout has a duty ratio which is different from that of the input pulse signal Sin. Although both of the leading and the trailing noises are cancelled by the noise cancell circuit, there is a case that the noise cancel circuit can not cancel the trailing noise, if the trailing noise has the noise width wider than the noise width Tn illustrated in FIG. 2.

Figure 3:
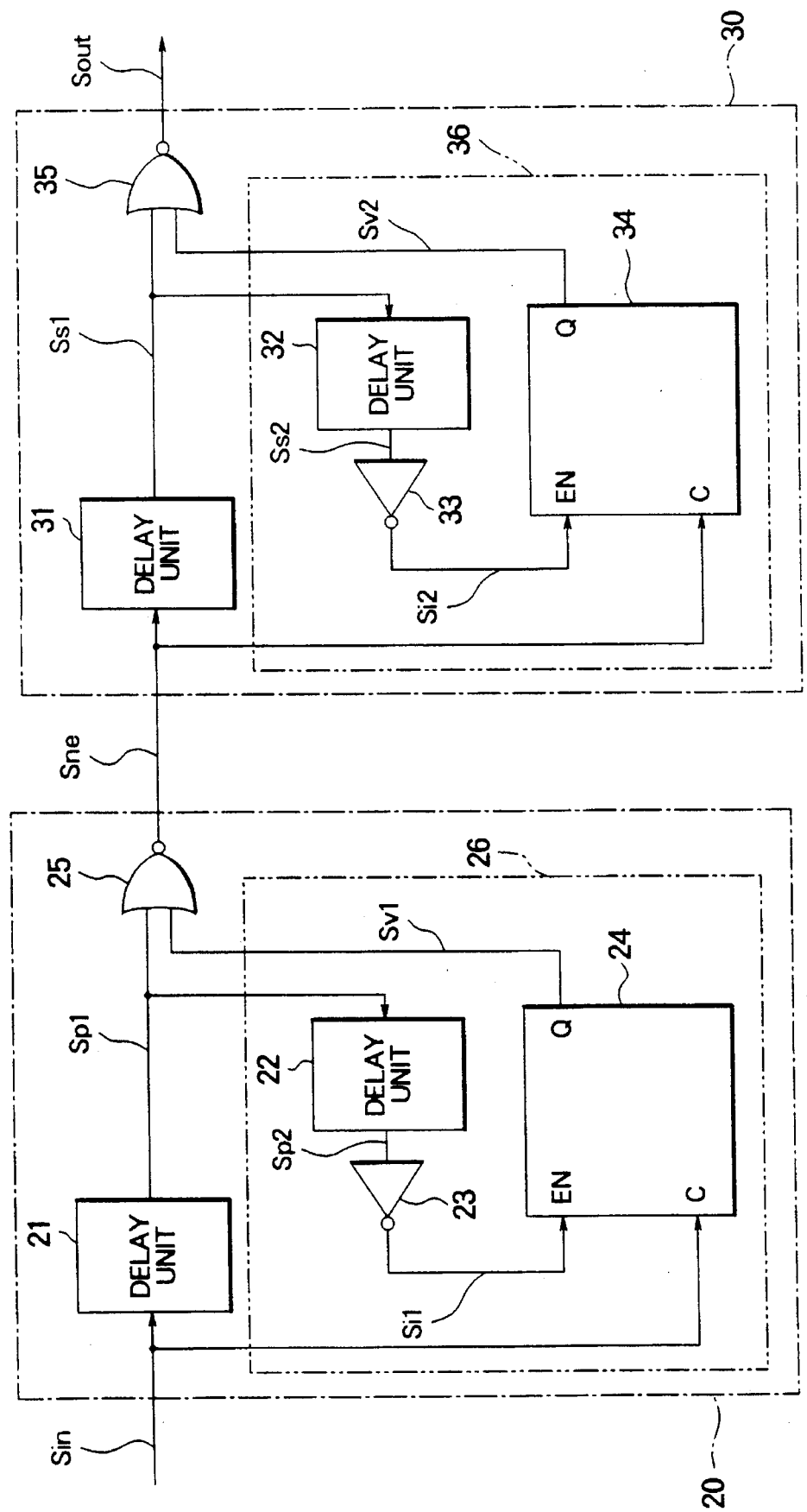
FIG. 3 shows a circuit diagram of a noise cancel circuit according to this invention.
Figure 4:
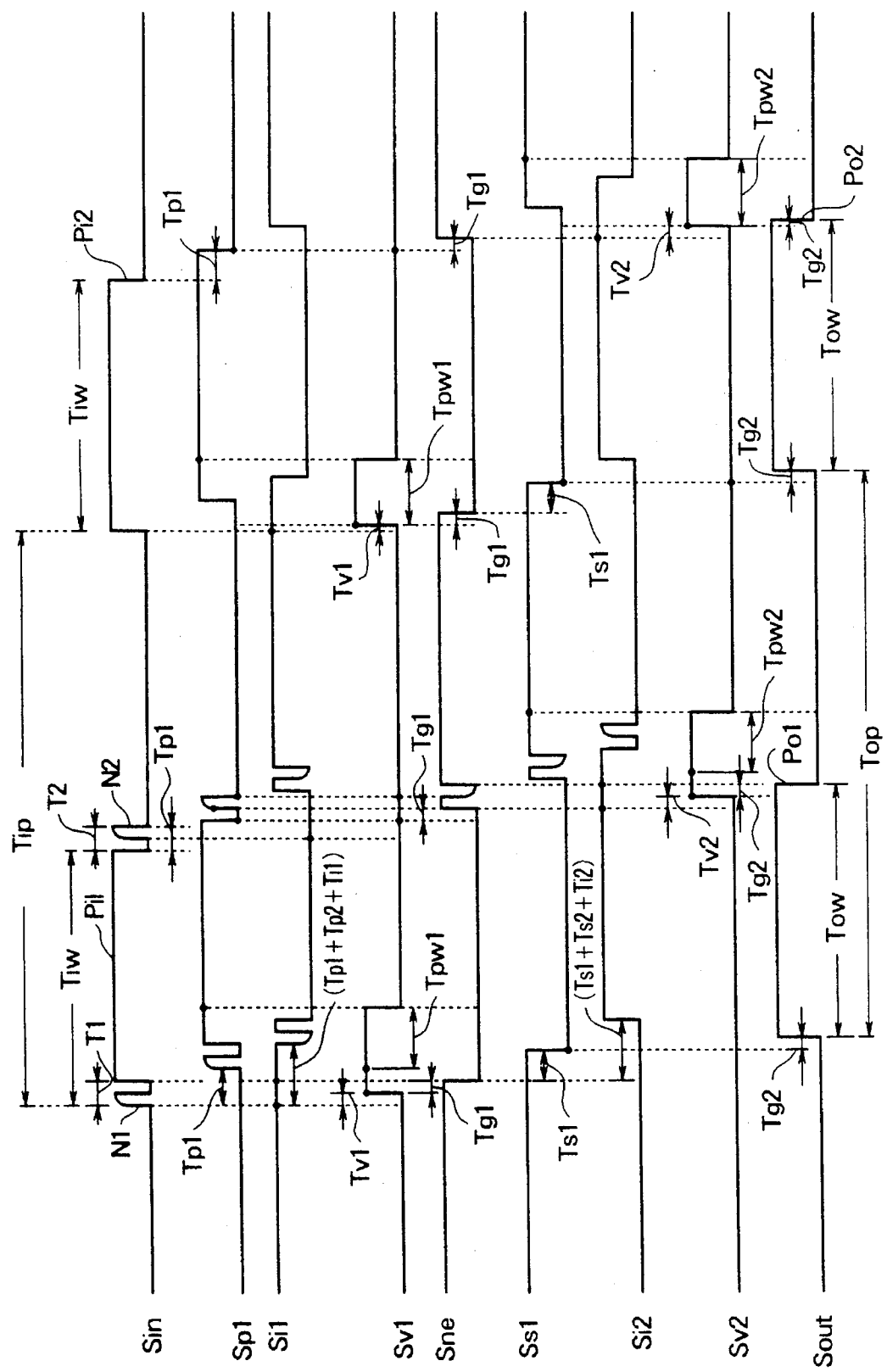
FIG. 4 shows waveforms for use in describing operation of the noise cancel circuit illustrated in FIG. 3.

Referring to FIGS. 3 and 4, the description will proceed to a noise cancel circuit according to a preferred embodiment of this invention. The noise cancel circuit comprises a leading noise cancel circuit 20 and a trailing noise cancel circuit 30. The noise cancel circuit is supplied with an input pulse signal Sin comprising a sequence of input pulses. As illustrated in a top line of FIG. 4, first and second input pulses are typically illustrated by Pi1 and Pi2. Each of the first and the second input pulses Pi1 and Pi2 has a leading edge and a trailing edge and is defined by a predetermined input pulse period Tip, a predetermined input pulse width Ti2, and a primary duty ratio given by Tiw/Tip. In the example, the input pulse signal Sin has a leading noise N1 and a trailing noise N2 occuring at the leading edge and the trailing edge, respectively, of the first input pulse Pi1. This is because the leading and the trailing noises N1 and N2 originate from the leading and the trailing edges, respectively. It will be assumed that the leading noise N1 is defined by a leading noise duration T1 which lasts from a leading edge of the leading noise N1 to the leading edge of the first input pulse Pi1. Similarly, the trailing noise N2 is defined by a trailing noise duration T2 which lasts from the trailing edge of the first input pulse Pi1 to a trailing edge of the trailing noise N2. It should be noted here that the predetermined input pulse period Tin and the predetermined input pulse width Tiw include the leading noise duration T1 because the leading noise N1 originates from the leading edge of the first input pulse Pi1.

In the following manner, the noise cancel circuit cancels the leading and the trailing noises N1 and N2 from the input pulse signal Sin and produces an output pulse signal Sout comprising a sequence of output pulses. As shown in a bottom line of FIG. 4, first and second output pulses are typically illustrated by Po1 and Po2 which correspond to the first and the second input pulses Pi1 and Pi2, respectively. Each of the first and the second output pulses Po1 and Po2 is defined by an output pulse period Top and an output pulse width Tow.

In FIG. 3, the leading noise cancel circuit 20 is supplied with the input pulse signal Sin and is for cancelling the leading noise N1 to produce a leading noise cancelled signal Sne. The trailing noise cancel circuit 30 is connected to the leading noise cancel circuit 20 and is for canceling the trailing noise N2 from the leading noise cancelled signal to produce a trailing noise cancelled signal as the output pulse signal Sout.

The leading noise cancel circuit 20 comprises a primary first delay unit 21, a primary second delay unit 22, a primary inverter 23, a primary monostable multivibrator 24 of a retriggerable type, and a primary NOR gate circuit 25. The primary first delay unit 21 is for giving a primary first delay time duration Tp1 to the input pulse signal Sin to produce a primary first delayed signal Sp1 having the primary first delay time duration Tp1 as shown in a second line of FIG. 4. The first delay time duration Tp1 is determined so that it is longer than a primary response time duration Tv1 (namely, Tp1>Tv1) of the primary monostable multivibrator 24. The primary response time duration Tv1 of the primary monostable multivibrator 24 is defined by a time duration from an input time of the input pulse signal Sin to an output time of a primary multivibrator pulse signal depicted at Sv1.

The primary second delay unit 22 is for giving a primary second delay time duration Tp2 to the primary first delayed signal Sp1 to produce a primary second delayed signal Sp2 having the primary second delay time duration Tp2. The primary second delayed signal Sp2 is inverted by the primary inverter 23 into a primary inverted signal Si1 as shown in a third line of FIG. 4. The primary inverter 23 has a primary inverter pass time duration Ti1 which is required in order to pass therethrogh. In addition, the primary second delay time duration Tp2 is determined so as to meet the following inequality given by:

$$Tp1+Tp2+Ti1>T1.$$

The primary monostable multivibrator 24 receives the input pulse signal Sin as a trigger signal and receives the primary inverted signal Si1 as an enable signal. The primary monostable multivibrator 24 is triggered off by the leading edge of the input pulse signal Sin while the primary inverted signal Si1 has a logic "1" level. As illustrated in a fourth line of FIG. 4, supplied with the input pulse signal Sin, the primary monostable multivibrator 24 produces the primary vibrator pulse signal Sv1 having a pulse width longer than a predetermined primary pulse width Tpw1 after a lapse of the primary response time duration Tv1 that begins from the leading edge of the leading noise N1. The predetermined primary pulse width Tpw1 is determined so that it is longer than the leading noise duration T1 and is shorter than the predetermined input pulse width Tiw (namely, T1<Tpw1<Tiw). As will later become clear, the primary second delay unit 22, the primary inverter 23, and the primary monostable multivibrator 24 collectively serve as a leading noise cancel instruction signal generating circuit 26.

The primary NOR gate circuit 25 is supplied with the primary first delayed signal Sp1 and the primary vibrator pulse signal Sv1 and carries out a logic NOR operation or calculation of the primary first delayed signal Sp1 and the primary vibrator pulse signal Sv1. The primary NOR gate circuit 25 has a primary gate pass time duration Tg1 which is required in order to pass therethrough. After a lapse of the primary gate pass time duration Tg1 that begins from the leading edge of the primary vibrator pulse signal Sv1, the primary NOR gate circuit 25 produces a primary NOR result signal representative of a primary NOR result as the leading noise cancelled signal Sne as illustrated in a fifth line of FIG. 4. It should be noted here that the leading noise cancelled signal Sne has inverted polarity.

The trailing noise cancel circuit 30 is connected to the leading noise cancel circuit 20 and is for cancelling the trailing noise N2 from the leading noise cancelled signal Sne to produce a trailing noise cancelled signal as the output pulse signal Sout. Like the leading noise cancel circuit 20, the trailing noise cancel circuit 30 comprises a secondary first delay unit 31, a secondary second delay unit 32, a secondary inverter 33, a secondary monostable multivibrator 34 of a retriggerable type, and a secondary NOR gate circuit 35. The secondary first delay unit 31 is supplied with the leading noise cancelled signal Sne and is for giving a secondary first delay time duration Ts1 to the leading noise cancelled signal Sne to produce a secondary first delayed signal Ss1 having the secondary first delay time duration Ts1 as shown in a sixth line of FIG. 4. The secondary first delay time duration Ts1 is determined so that it is longer than a secondary response time duration Tv2 (namely, Ts1>Tv2) of the secondary monostable multivibrator 34. In practice, the secondary first delay time duration Ts1 is determined so as to be equal to the primary first delay time duration Tp1 for the reason which will later become clear. As mentioned in conjunction with the primary monostable multivibrator 24, the secondary response time duration Tv2 of the secondary monostable multivibrator 34 is defined by a time duration from an input time of the leading noise cancelled signal Sne to an output time of a secondary multivibrator pulse signal depicted at Sv2. The secondary response time duration Tv2 is determined so as to be equal to the primary response time duration Tv1.

The secondary second delay unit 32 is supplied with the secondary first delayed signal Ss1 and is for giving a secondary second delay time duration Ts2 to the secondary first delayed signal Ss1 to produce a secondary second delayed signal Ss2 having the secondary second delay time duration Ts2. The secondary second delayed signal Ss2 is inverted by the secondary inverter 33 into a secondary inverted signal Si2 as shown in a seventh line of FIG. 4. The secondary inverter 33 has a secondary inverter pass time duration Ti2 which is required in order to pass therethrough. The secondary second delay time duration Ts2 is determined so as to meet the following inequality given by:

$$Ts1+Ts2+Ti2>T2.$$

The secondary monostable multivibrator 34 receives the leading noise cancelled signal Sne as the trigger signal and receives the secondary inverted signal Si2 as the enable signal. The secondary monostable multivibrator 34 is trigger off by the leading edge of the leading noise cancelled signal Sne while the secondary inverted signal Si2 has the logic "1" level. As illustrated in an eighth line of FIG. 4, supplied with the leading noise cancelled signal Sne, the secondary monostable multivibrator 34 produces the secondary vibrator pulse signal Sv2 having a pulse width longer than a predetermined secondary pulse width Tpw2 after a lapse of the secondary response time duration Tv2 that begins from the leading edge of the leading noise cancelled signal Sne. The predetermined secondary pulse width Tpw2 is determined so that it longer than the trailing noise duration T2 and is shorter than a difference between the predetermined input pulse period Tip and the predetermined input pulse width Tiw (namely, T2<Tpw2<(Tip−Tiw)). As will later become clear, the secondary second delay unit 32, and the secondary inverter 33, and the secondary monostable multivibrator 34 collectively serve as a trailing noise cancel instruction signal generating circuit 36.

The secondary NOR gate circuit 35 is supplied with the secondary first delayed signal Ss1 and the secondary vibrator pulse signal Sv2 and carries out the logic NOR operation of the secondary first delayed signal Ss1 and the secondary vibrator pulse signal Sv2. The secondary NOR gate circuit 35 has a secondary gate pass time duration Tg2 which is required in order to pass therethrough. After a lapse of the secondary gate pass time duration Tg2 that begins from the trailing edge of the secondary first delayed signal Ss1, the secondary NOR gate circuit 35 produces a secondary NOR result signal representative of a secondary NOR result as the output pulse signal Sout.

The description will proceed to an operation in a case that the first input pulse Pi1 is accompanied by the leading and the trailing noises N1 and N2. At first, the description will be made as regards the operation of the leading noise cancel circuit 20. When the leading noise cancel circuit 20 receives the leading noise N1, the primary inverted signal Si1 has the logic "1" level as shown in the third line of FIG. 4. In this event, the primary monostable multivibrator 24 is triggered by the leading edge of the leading noise N1 and produces the primary vibrator pulse signal Sv1 of the logic "1" level after a lapse of the primary response time duration Tv1 as illustrated in the fourth line of FIG. 4. When the leading noise cancel circuit 20 receives the first input pulse Pi1, the primary inverted signal Si1 still has the logic "1" level. Accordingly, the primary monostable multivibrator 24 is triggered off again by the leading edge of the first input pulse Pi1. As a result, the primary monostable multivibrator 24 continues pulse of the primary vibrator output signal Sv1 of the logic "1" level.

The primary first delay unit 21 produces the primary first delayed signal Sp1 having the primary first delay time duration Tp1 as shown in the second line of FIG. 4. Simultaneously, the primary second delay unit 22 produces the primary second delayed signal Sp2. The primary second delayed signal Sp2 has a delay time duration which is equal to a sum of the primary first delay time duration Tp1 and the primary second delay time duration Tp2. Then, the primary inverter 23 produces the primary inverted signal Si1 having a delay time duration which is equal to a sum of the primary first delay time duration Tp1, the primary second delay time duration Tp2, and the primary inverter pass time duration Ti1 (namely, Tp1+Tp2+Ti1) as shown in the third line of FIG. 4.

The logic level of the primary vibrator pulse signal Sv1 changes from the logic "1" level to the logic "0" level after a lapse of a predetermined primary pulse width Tpw1 that begins after a lapse of the primary response time duration Tw1 started from the leading edge of the leading noise N1. At the time, the primary first delay unit 21 produces the primary first delayed signal Sp1 having the logic "1" level. The primary NOR gate circuit 25 carries out the logic NOR operation of the primary first delayed signal Sp1 and the primary vibrator pulse signal Sv1 and produces, after a lapse of the primary gate pass time duration Tg1 started from the leading edge of the primary vibrator pulse signal Sv1, the leading noise cancelled signal Sne in which the leading noise N1 is cancelled. This means that the primary vibrator pulse signal Sv1 serves as a leading noise cancel instruction signal which instructs the cancel of the leading noise N1. This is the reason why the primary second delay unit 22, the primary inverter 23, and the primary monostable multivibrator 24 collectively serve as the leading noise cancel instruction signal generating circuit 26. Furthermore, the primary NOR gate circuit 25 serves as a leading noise cancel gate circuit which is for cancelling the leading noise N1 from the primary first delayed signal Sp1 in accordance with the leading noise cancel instruction signal, namely, the primary vibrator pulse signal Sv1.

The description will proceed to the operation of the trailing noise cancel circuit 30. The secondary first delay unit 31 gives the secondary first delay time duration Ts1 to the leading noise cancelled signal Sne and produces the secondary first delayed signal Ss1 having the secondary first delay time duration Ts1 as shown in sixth line of FIG. 4. Similarly, the secondary second delay unit 32 produces the secondary second delayed signal Ss2. The secondary second delayed signal Ss2 has a delay time duration which is equal to a sum of the secondary first delay time duration Ts1 and the secondary second delay time duration Ts2. Then, the secondary inverter 33 produces the secondary inverted signal Si2 which has a delay time duration which is equal to a sum of the secondary first delay time duration Ts1, the secondary second delay time duration Ts2, and the secondary inverter pass time duration Ti2 (namely, Ts1+Ts2+Ti2) as shown in the seventh line of FIG. 4. Accordingly, the logic level of the secondary inverted signal Si2 changes from the logic "0" level to the logic "1" level after a lapse of a time duration of (Ts1+Ts2++Ti2) that begins from the trailing edge of the leading noise cancelled signal Sne.

A noise component corresponding to the trailing noise N2 appears just after the leading edge of the leading noise cancelled signal Sne. At that time, the secondary inverted signal Si2 still has the logic "1" level. In this event, the secondary monostable multivibrator 34 is trigger off by a leading edge of the noise component of the leading noise cancelled signal Sne and produces the secondary vibrator pulse signal Sv2 having the logic "1" level after a lapse of the secondary response time duration Tv2 that begins from the leading edge of the leading noise cancelled signal Sne. Moreover, the secondary monostable multivibrator 34 is triggered off again by the leading edge of the leading noise cancelled signal Sne and continuous output of the secondary vibrator pulse signal Sv2 having the logic "1+" level during a sum of the trailing noise duration T2 and the predetermined secondary pulse width Tpw2.

The secondary NOR gate circuit 35 carries out the logic NOR operation of the secondary first delayed signal Ss1 and the secondary vibrator pulse signal Sv2 and produces, after a lapse of the secondary gate pass time duration Tg2 that begins from the trailing edge of the secondary first delayed signal Ss1, the first output pulse Po1 having the output pulse width Tow as the output pulse signal Sout in which the trailing noise N2 is cancelled. This means that the secondary vibrator pulse signal Sv2 serves as a trailing noise cancel instruction signal which instructs the cancel of the trailing noise N2. Under the circumstances, the secondary second delay unit 32, the secondary inverter 33, and the secondary monostable multivibrator 34 are collectively called the trailing noise cancel instruction signal generating circuit 36. The secondary NOR gate circuit 35 serves as a trailing noise cancel gate circuit which is for cancelling the trailing noise N2 from the secondary first delayed signal Ss1 in accordance with the trailing noise cancel instruction signal, namely, the secondary vibrator pulse signal Sv2.

The description will be made as regards an operation in a case that noise cancel circuit receives the second input pulse Pi2 which is not accompanied by the leading and the trailing noises. At first, the description will be made as regards the operation of the leading noise cancel circuit 20. On reception of the leading edge of the second input pulse Pi2, the primary inverted signal Si1 has the logic "1" level. In this event, the primary monostable multivibrator 24 is triggered by the leading edge of the second input pulse Pi2 and produces, after a lapse of the primary response time duration Tv1, the primary vibrator pulse signal Sv1 which has the primary pulse width Tpw1 and has the logic "1" level.

The primary first delay unit 21 produces the primary first delayed signal Sp1 having the primary first delay time duration Tp1. Then, the primary inverter 23 produces the primary inverted signal Si1 having the delay time duration of (Tp1+Tp2+Ti1).

The logic level of the primary vibrator pulse signal Sv1 changes from the logic "1" level to the logic "0" level after a lapse of the predetermined primary pulse width Tpw1 that begins after a lapse of the primary response time duration Tv1 started from the leading edge of the input pulse Pi2. At this time, the primary first delay unit 21 produces the primary first delayed signal Sp1 having the logic "1" level. The primary NOR gate circuit 25 carries out the logic NOR operation of the primary first delayed signal Sp1 and the primary vibrator pulse signal Sv1 and produces, after a lapse of the primary gate pass time duration Tg1 started from the leading edge of the primary vibrator pulse signal Sv1, the primary NOR result signal as the leading noise cancelled signal Sne having the logic "0" level.

The description will proceed to the operation of the trailing noise cancel circuit 30. The secondary first delay unit 31 produces the secondary first delayed signal Ss1 having the secondary first delay time duration Ts1. The secondary second delayed signal Ss2 has a delay time duration which is equal to a sum of the secondary first delay time duration Ts1 and the secondary second delay time duration Ts2. Then, the secondary inverter 33 produces the secondary inverted signal Si2 having the delay time duration of (Ts1+Ts2+Ti2). Accordingly, the logic level of the secondary inverted signal Si2 changes from the logic "0" level to the logic "1" level after a lapse of a time duration of (Ts1+Ts2+Ti2) that begins from the trailing edge of the leading noise cancelled signal Sne. The secondary monostable multivibrator 34 is triggered off by the leading edge of the leading noise cancelled signal Sne and produces the secondary vibrator pulse signal Sv2 having the predetermined secondary pulse width Tpw2 and the logic "1" level after a lapse of the secondary response time duration Tv2. The secondary NOR gate circuit 35 produces the secondary NOR result signal, namely, the second output pulse Po2 having the output pulse width Tow, as the output pulse signal Sout.

The description will be made as regards the relation between the primary duty ratio Tiw/Tip and a secondary duty ratio Tow/Top. The first output pulse Po1 rises after a lapse of a time duration (Tw1+Tg1+Ts1+Tg2) started from the leading edge of the leading noise N1. On the other hand, the first output pulse Po1 falls after a lapse of a time duration (Tp1++Tg1+Tv2+Tg2) started from the trailing edge of the first input pulse Pi1. Similarly, the second output pulse Po2 rises after a lapse of a time duration (Tv1+Tg1+Ts1+Tg2) started from the leading edge of the second input pulse Pi2. The second output pulse Po2 falls after a lapse of a time duration (Tp1+Tg1+Tv2+Tg2) started from the trailing edge of the second input pulse Pi2. Inasmuch as the primary first delay time duration Tp1 and the primary response time duration Tv1 are equal to the secondary first delay time duration Ts1 and the secondary response time duration Tv2, respectively, the output pulse width Tow of the first and the second output pulse Po1 and Po2 becomes equal to the predetermined input pulse width Tiw of the first and the second input pulses Pi1 and Pi2. In other words, the secondary duty ratio Tow/Top becomes equal to the primary duty ratio Tiw/Tip.

While this invention has thus far been described in conjunction with a preferred embodiment thereof, it will readily be possible for those skilled in the art to put this invention into practice in various other manners. For example, a normal type monostable multivibrator may be used in place of the retriggerable type monostable multivibrator. In this event, a pulse width of the monostable multivibrator is determined so that it is possible to cancel the leading and the trailing noises.

What is claimed is:

1. A noise cancel circuit for cancelling leading and trailing noise components from an input pulse signal comprising a sequence of input pulses each of which has a leading edge and a trailing edge and which is defined by a predetermined input pulse period and a predetermined input pulse width, said leading and said trailing noise components originating from said leading and said trailing edges, respectively, said noise cancel circuit producing an output pulse signal comprising a sequence of output pulses each of which is defined by an output pulse period equal to said predetermined input pulse period and an output pulse width equal to said predetermined input pulse width, said noise cancel circuit comprising:

a leading noise cancel circuit supplied with said input pulse signal for cancelling said leading noise component from said input pulse signal to produce a leading noise cancelled signal; and a trailing noise cancel circuit connected to said leading noise cancel circuit for cancelling said trailing noise component from said leading noise cancelled signal to produce a trailing noise cancelled signal as said output pulse signal.

2. A noise cancel circuit as claimed in claim 1, wherein said leading noise cancel circuit comprises:

a primary first delay unit supplied with said input pulse signal for giving a primary first delay to said input pulse signal to produce a primary first delayed signal having said primary first delay;

a leading noise cancel instruction signal generating circuit supplied with said input pulse signal and said primary first delayed signal for generating a leading noise cancel instruction signal which instructs cancel of said leading noise component; and a leading noise cancel gate circuit connected to said primary first delay unit and said leading noise cancel instruction signal generating circuit for cancelling said leading noise component from said primary first delayed signal in accordance with said leading noise cancel instruction signal to produce said leading noise cancelled signal.

3. A noise cancel circuit as claimed in claim 2, wherein said trailing noise cancel circuit comprises:

a secondary first delay unit supplied with said leading noise cancelled signal for giving a secondary first delay to said leading noise cancelled signal to produce a secondary first delayed signal having said secondary first delay;

a trailing noise cancel instruction signal generating circuit supplied with said leading noise cancelled signal and said secondary first delayed signal for generating a trailing noise cancel instruction signal which instructs cancel of said trailing noise component; and a trailing noise cancel gate circuit connected to said secondary first delay unit and said trailing noise cancel instruction signal generating circuit for cancelling said trailing noise component from said secondary first delayed signal in accordance with said trailing noise cancel instruction signal to produce said trailing noise cancelled signal.

4. A noise cancel circuit for cancelling leading and trailing noise components from an input pulse signal comprising a sequence of input pulses each of which has a leading edge and a trailing edge and which is defined by a predetermined input pulse period and a predetermined input pulse width, said leading and said trailing noise components originating from said leading and said trailing edges, respectively, said noise cancel circuit producing an output pulse signal comprising a sequence of output pulses each of which is defined by an output pulse period equal to said predetermined input pulse period and an output pulse width equal to said predetermined input pulse width, said noise cancel circuit comprising:

a leading noise cancel circuit supplied with said input pulse signal for cancelling said leading noise component from said input pulse signal to produce a leading noise cancelled signal; and a trailing noise cancel circuit connected to said leading noise cancel circuit for cancelling said trailing noise component from said leading noise cancelled signal to produce a trailing noise cancelled signal as said output pulse signal;

said leading noise cancel circuit including a primary first delay unit supplied with said input pulse signal for giving a primary first delay to said input pulse signal to produce a primary first delayed signal having said primary first delay;

a leading noise cancel instruction signal generating circuit supplied with said input pulse signal and said primary first delayed signal for generating a leading noise cancel instruction signal which instructs cancel of said leading noise component; and a leading noise cancel gate circuit connected to said primary first delay unit and said leading noise cancel instruction signal generating circuit for cancelling said leading noise component from said primary first delayed signal in accordance with said leading noise cancel instruction signal to produce said leading noise cancelled signal;

said leading noise cancel instruction signal generating circuit comprising:

a primary second delay unit connected to said primary first delay unit for giving a primary second delay to said primary first delayed signal to produce a primary second delayed signal;

a primary inverter connected to said primary second delay unit for inverting said primary second delayed signal into an inverted primary second delayed signal; and a primary monostable multivibrator supplied with said input pulse signal as a trigger signal and with said inverted primary second delayed signal as an enable signal for producing a primary vibrator pulse signal, as said leading noise cancel instruction signal, having a primary pulse width;

said leading noise cancel gate circuit being implemented by a primary NOR gate circuit connected to said first delay unit and said primary monostable multivibrator for carrying out a logical NOR operation of said primary first delayed signal and said primary vibrator pulse signal to produce a primary NOR result signal as said leading noise cancelled signal.

5. A noise cancel circuit as claimed in claim 4, wherein said primary monostable multivibrator is a retriggerable type monostable multivibrator.

6. A noise cancel circuit for cancelling leading and trailing noise components from an input pulse signal comprising a sequence of input pulses each of which has a leading edge and a trailing edge and which is defined by a predetermined input pulse period and a predetermined input pulse width, said leading and said trailing noise components originating from said leading and said trailing edges, respectively, said noise cancel circuit producing an output pulse signal comprising a sequence of output pulses each of which is defined by an output pulse period equal to said predetermined input pulse period and an output pulse width equal to said predetermined input pulse width, said noise cancel circuit comprising:

a leading noise cancel circuit supplied with said input pulse signal for cancelling said leading noise component from said input pulse signal to produce a leading noise cancelled signal; and a trailing noise cancel circuit connected to said leading noise cancel circuit for cancelling said trailing noise component from said leading noise cancelled signal to produce a trailing noise cancelled signal as said output pulse signal;

said leading noise cancel circuit comprising:

a primary first delay unit supplied with said input pulse signal for giving a primary first delay to said input pulse signal to produce a primary first delayed signal having said primary first delay;

a leading noise cancel instruction signal generating circuit supplied with said input pulse signal and said primary first delayed signal for generating a leading noise cancel instruction signal which instructs cancel of said leading noise component; and a leading noise cancel gate circuit connected to said primary first delay unit and said leading noise cancel instruction signal generating circuit for cancelling said leading noise component from said primary first delayed signal in accordance with said leading noise cancel instruction signal to produce said leading noise cancelled signal;

said trailing noise cancel circuit comprising:

a secondary first delay unit supplied with said leading noise cancelled signal for giving a secondary first delay to said leading noise cancelled signal to produce a secondary first delayed signal having said secondary first delay;

a trailing noise cancel instruction signal generating circuit supplied with said leading noise cancelled signal and said secondary first delayed signal for generating a trailing noise cancel instruction signal which instructs cancel of said trailing noise component; and a trailing noise cancel gate circuit connected to said secondary first delay unit and said trailing noise cancel instruction signal generating circuit for cancelling said trailing noise component from said secondary first delayed signal in accordance with said trailing noise cancel instruction signal to produce said trailing noise cancelled signal;

said trailing noise cancel instruction signal generating circuit comprising:

a secondary second delay unit connected to said secondary first delay unit for giving a secondary second delay to said secondary first delayed signal to produce a secondary second delayed signal;

a secondary inverter connected to said secondary second delay unit for inverting said secondary second delayed signal into an inverted secondary second delayed signal; and a secondary monostable multivibrator supplied with said leading noise cancelled signal as a trigger signal and with said inverted secondary second delayed signal as an enable signal for producing a secondary vibrator pulse signal, as said trailing noise cancel instruction signal, having a secondary pulse width;

said trailing noise cancel gate circuit being implemented by a secondary NOR gate connected to said secondary first delay unit and said secondary monostable multivibrator for carrying out a logical NOR operation of said secondary first delayed signal and said secondary vibrator pulse signal to produce a secondary NOR result signal as said trailing noise cancelled signal.

7. A noise cancel circuit as claimed in claim 6, wherein said secondary monostable multivibrator is a retriggerable type monostable multivibrator.

* * * * *

UNITED STATES PATENT AND TRADEMARK OFFICE
CERTIFICATE OF CORRECTION

PATENT NO. : 5,572,549
DATED : November 5, 1996
INVENTOR(S) : Yuka SHIMOMURA

It is certified that error appears in the above-identified patent and that said Letters Patent is hereby corrected as shown below:

Column 3, line 26, delete "$Ti_2$" and insert -- Tiw --.

Column 3, line 39, delete "Tin" and insert -- Tip --.

Signed and Sealed this

Twenty-fifth Day of March, 1997

Attest:

BRUCE LEHMAN

Attesting Officer   Commissioner of Patents and Trademarks